(12) United States Patent
Swaminathan et al.

(10) Patent No.: US 10,049,911 B2
(45) Date of Patent: Aug. 14, 2018

(54) TEMPORALLY PULSED AND KINETICALLY MODULATED CVD DIELECTRICS FOR GAPFILL APPLICATIONS

(71) Applicant: Lam Research Corporation, Fremont, CA (US)

(72) Inventors: Shankar Swaminathan, Beaverton, OR (US); Frank L. Pasquale, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/268,044

(22) Filed: Sep. 16, 2016

(65) Prior Publication Data

US 2018/0082886 A1  Mar. 22, 2018

(51) Int. Cl.
*C23C 16/00* (2006.01)
*H01L 21/762* (2006.01)
*H01L 21/02* (2006.01)
*C23C 16/455* (2006.01)
*C23C 16/44* (2006.01)

(52) U.S. Cl.
CPC .... *H01L 21/76224* (2013.01); *C23C 16/4408* (2013.01); *C23C 16/45536* (2013.01); *H01L 21/0228* (2013.01); *H01L 21/02211* (2013.01); *H01L 21/02274* (2013.01)

(58) Field of Classification Search
CPC ..................... C23C 16/4408; C23C 16/45536
See application file for complete search history.

(56) References Cited

U.S. PATENT DOCUMENTS

2008/0193739 A1*  8/2008  Dickey ................. C23C 16/045
                                                                428/317.9
2014/0141542 A1*  5/2014  Kang .................... C23C 16/345
                                                                438/14

\* cited by examiner

*Primary Examiner* — Kelly M Gambetta
(74) *Attorney, Agent, or Firm* — Martine Penilla Group, LLP

(57) ABSTRACT

A method for performing temporally pulsed chemical vapor deposition (CVD) is provided, including: providing a first reactant configured to adsorb on exposed surfaces of a substrate in a self-limiting manner, the first reactant being provided at a partial pressure so that the first reactant diffuses into a gap feature of the substrate; performing a first purge operation, the first purge operation being configured to partially purge the first reactant, so that gas phase first reactant species remain in the gap feature; providing a second reactant to the process chamber, the second reactant being configured to react with the first reactant to form a film product, including reaction of the provided second reactant with the adsorbed first reactant species, and reaction of the provided second reactant with the gas phase first reactant species in the gap feature; performing a second purge operation.

20 Claims, 9 Drawing Sheets

□ = First Reactant
○ = Second Reactant

TEMPORALLY PULSED AND KINETICALLY MODULATED CVD DIELECTRICS FOR GAPFILL APPLICATIONS

BACKGROUND

1. Field of the Disclosure

The present implementations relate to methods and systems for depositing films, and more specifically, to providing temporally pulsed and kinetically modulated chemical vapor deposition (CVD) for gapfill applications, such as dielectric gapfill.

2. Description of the Related Art

As feature sizes shrink, achieving conformal deposition in high aspect ratio features becomes ever more challenging. For example, it is difficult to achieve good step coverage in gap features (e.g. trenches or holes) less than 25 nanometers wide with aspect ratios in the range of 1:20 to 1:30. One example where such gapfill is required is that of slit gapfill in 3DNAND to form, for example, isolation structures. In these applications, high aspect ratio structures called slits or channel holes, which can exceed 1:30 aspect ratios, need to be completely filled with high quality oxide without any airgaps or voids that may compromise performance (e.g. electrical isolation performance).

Traditional processes such as sub-atmospheric chemical vapor deposition (SACVD) or even furnace/single wafer atomic layer deposition (ALD) can leave large voids or seams at the interface. SACVD and its associated processes have well-known overburden or pinch off problems at the tops of gap features. For example, FIG. 1A illustrates a cross-section of a portion of a substrate 100 having a gap feature 102 (e.g. trench or hole). Deposition of a film 104 by a conventional chemical vapor deposition (CVD) process to fill the gap feature 102 produces higher deposition rates along higher portions of the sidewalls 104 and lower deposition rates along lower portions of the sidewalls 104. In other words, deposition rate increases with increasing depth in the gap feature 102. As shown at FIG. 1B, this can result in formation of a void 106 in the structure of the gapfill material, resulting from closure occurring at the top of the gap feature before gapfill is complete.

Some post-deposition processes (e.g. post-deposition anneal processes) have been developed to close such voids. However, such processes introduce an additional step that is detrimental to throughput.

Even carefully controlled ALD still leaves a seam at the interface of the two growing sidewalls, which may cause problems by exhibiting different behavior (e.g. higher etch rates) than other portions of the deposited film during subsequent processing steps. FIG. 1C illustrates a cross-section of the substrate 100 showing the gap feature 102 being filled using an ALD process. Conformal layers 110 are deposited in the gap feature 102, coating the bottom and sidewalls in successive deposition cycles to build up the thickness of the film over time. However, as shown at FIG. 1D, this does not produce a true bulk material as the closure of the sidewalls results in the formation of a seam 112. This seam 112 is essentially a microscopic interface within the gapfill that can cause problems during subsequent processing steps.

Introducing an etch process between ALD deposition steps seeks to ameliorate the issue of seam formation, but is only partially successful, and not cost-effective since overall throughputs plummet due to the addition of extra processing steps.

It is in this context that implementations of the disclosure arise.

SUMMARY

Implementations of the present disclosure provide methods, apparatus, and systems to enable temporally pulsed and kinetically modulated CVD for gapfill applications.

A new deposition paradigm for gapfill applications is herein disclosed, leveraging temporally-separated sequences from atomic layer deposition (ALD) paradigms combined with the Langmuirian adsorption kinetics of chemical vapor deposition (CVD) to provide seamless and void-free bottom-up fill of gap features.

In some implementations, a method for performing temporally pulsed chemical vapor deposition (CVD) on a substrate is provided, including: providing a first reactant to a process chamber in which the substrate is disposed, the first reactant being configured to adsorb on exposed surfaces of the substrate in a self-limiting manner, the first reactant being provided at a partial pressure so that the first reactant diffuses into a gap feature of the substrate; performing a first purge operation, the first purge operation being configured to partially purge the first reactant from the process chamber, wherein the first purge operation does not completely remove the first reactant from the gap feature, so that gas phase first reactant species remain in the gap feature; providing a second reactant to the process chamber, the second reactant being configured to react with the first reactant to form a film product, including reaction of the provided second reactant with the adsorbed first reactant species, and reaction of the provided second reactant with the gas phase first reactant species in the gap feature; performing a second purge operation.

In some implementations, the gas phase first reactant species remaining in the gap feature following the first purge operation are distributed along a concentration gradient such that the concentration of the gas phase first reactant species increases with increasing depth in the gap feature.

In some implementations, the method provides for increased deposition rate of the film with increased depth in the gap feature.

In some implementations, the reaction of the provided second reactant with adsorbed first reactant species forms the film product on the surfaces on which the first reactant has adsorbed, and wherein the reaction of the provided second reactant with the gas phase first reactant species in the gap feature forms the film product in the gas phase, the film product formed in the gas phase being subsequently deposited on a surface of the gap feature.

In some implementations, the second reactant is provided at a partial pressure that is less than the partial pressure of the first reactant.

In some implementations, a temperature of the process chamber is controlled to provide for the partial pressures of the first reactant and the second reactant.

In some implementations, the method further includes: repeating the operations of the method for a predefined number of cycles so as to deposit multiple layers of the film product, wherein a deposition amount of the film product in the gap feature increases with increasing depth in the gap feature.

In some implementations, exposing the substrate to the first reactant includes pulsing the first reactant and the additive into a carrier gas stream that is flowed into the process chamber in which the substrate is disposed; wherein exposing the substrate to the second reactant includes, pulsing the second reactant into the carrier gas stream.

In some implementations, performing the first purge operation includes continuing the flow of the carrier gas stream through the process chamber and evacuating the process chamber; wherein performing the second purge operation includes continuing the flow of the carrier gas stream through the process chamber and evacuating the process chamber.

In some implementations, the film product is an oxide of silicon; and, wherein the first reactant is a silicon-containing precursor.

In some implementations, the first reactant is diisopropylaminosilane (DIPAS), bis(diethylamine)silane (BDEAS) or bis(tertiarybuthylamine)silane (BTBAS).

In some implementations, the second reactant is oxygen.

In some implementations, the first reactant is provided at a partial pressure in the range of approximately 0.5 to 10 Torr; wherein the second reactant is provided at a partial pressure in the range of approximately 0.5 to 10 Torr.

In some implementations, a duration of the first purge operation is in the range of approximately 0.01 to 0.10 seconds; wherein a duration of the second purge operation is in the range of approximately 0.01 to 0.10 seconds.

DESCRIPTION

Figure 1A:
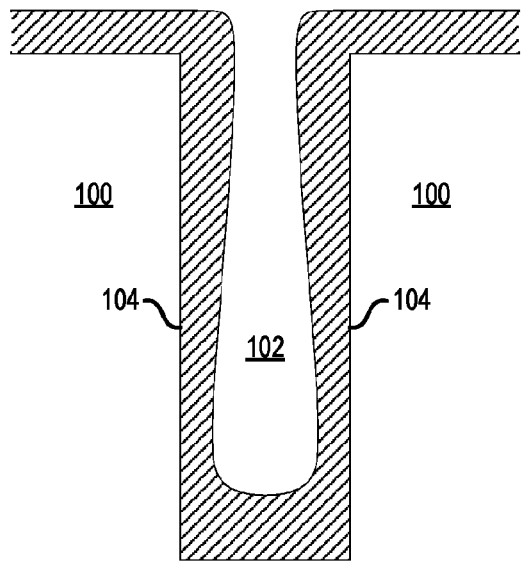
FIGS. 1A and 1B illustrate deposition in a gap feature by a conventional chemical vapor deposition (CVD) process.
Figure 1B:
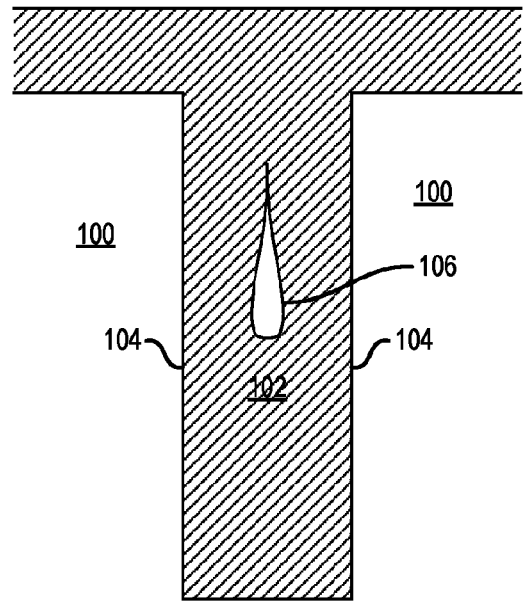
Figure 1C:
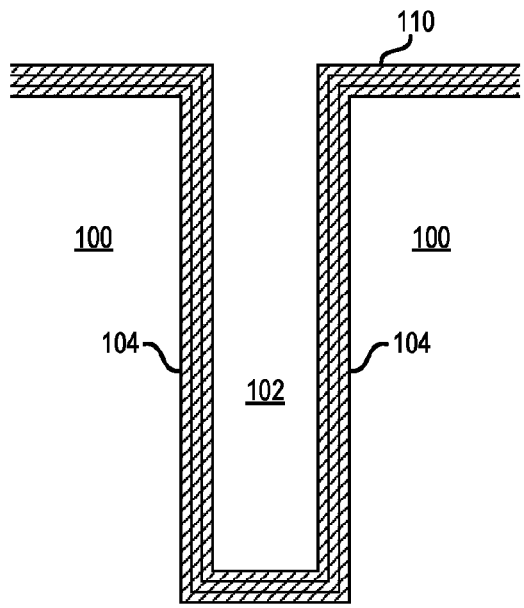
FIGS. 1C and 1D illustrate deposition in a gap feature by a conventional atomic layer deposition (ALD) process.
Figure 1D:
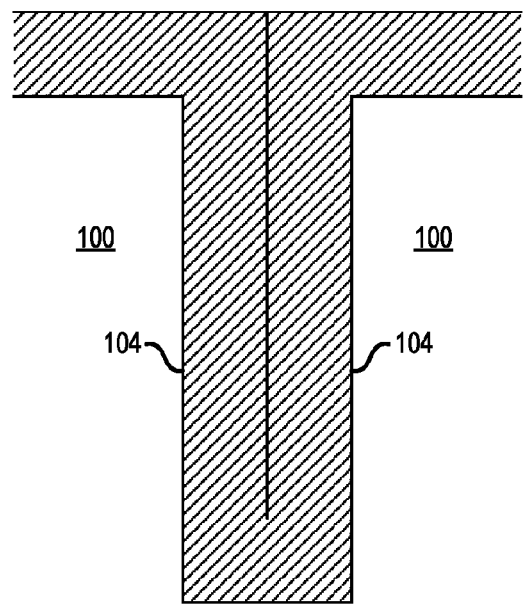

Implementations of the disclosure provide methods, apparatus, and systems for temporally pulsed and kinetically modulated chemical vapor deposition (CVD) for gapfill applications. It should be appreciated that the present implementations can be implemented in numerous ways, such as a process, an apparatus, a system, a device, or a method. Several implementations are described below.

A method for depositing dielectrics (e.g. oxides, nitrides, carbides of Si, and multiple metal centers) to ensure bottom-up void-free gapfill in high aspect ratio structures is provided. Broadly speaking, the temporally pulsed CVD method disclosed herein utilizes ALD precursors and sequences to operate in a quasi-ALD regime that ensures surface-dominated reactions that allows for control of growth rates on the field vs sidewall regimes. An advantage over simply low-growth rate or kinetically modulated CVD is in the precise control of the surface adsorption of the ALD precursor and oxidant (for example, the ALD precursor diisoproplyaminosilane (DIPAS, a silicon source) and oxygen radicals to create silicon dioxide).

Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes include mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bi(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

A general atomic layer deposition (ALD) process consists of sequential alternating pulses of gaseous chemical reactants that react with the substrate surface. The individual gas-surface reactions of each reactant are called half-reactions. During the first half-reaction, a first reactant is pulsed into a chamber for a designated amount of time to allow the first reactant to fully react with the substrate surface through a self-limiting process that deposits a single monolayer on the substrate surface. Subsequently, the chamber is purged with an inert carrier gas (typically $N_2$ or Ar) to remove any unreacted first reactant or reaction by-products. This is then followed by a pulse of a second reactant, which reacts with the previously deposited first reactant, creating up to one layer of the desired material at the substrate surface. A subsequent second purge is performed to remove any unused second reactant and/or reaction by-products. This process is then cycled until a desired film thickness is achieved.

In contrast to the standard ALD process sequence just described, implementations of the disclosure utilize a process sequence similar to an ALD sequence in terms of the temporal separation of reactant dosing (Reactant1-Purge1-Reactant2-Purge2 sequence), but with modulated reactant dose times/flows and purge times/flows to induce surface-dominated CVD modes. In accordance with implementations described herein, this includes using sub-saturated purge regimes that are sufficient to induce surface-reactions but avoid predominant gas phase reactions that could cause overgrowth at the tops of gap features, a problem which is sometimes referred to as "bread-loafing."

Additionally, within the carefully constructed temporally pulsed CVD sequence, one can finely modulate the surface kinetics via adjustment of the partial pressures of reactants during both half-reactions to induce different pulsed CVD reaction rates in the top field vs. sidewall vs. trench bottom field surfaces. The partial pressures can be chosen based on the masses of the precursor and oxidant species, which will largely determine their diffusivity in the trench. As a consequence, process windows can be established for bottom-up gapfill for temporally-pulsed CVD.

Figure 2:
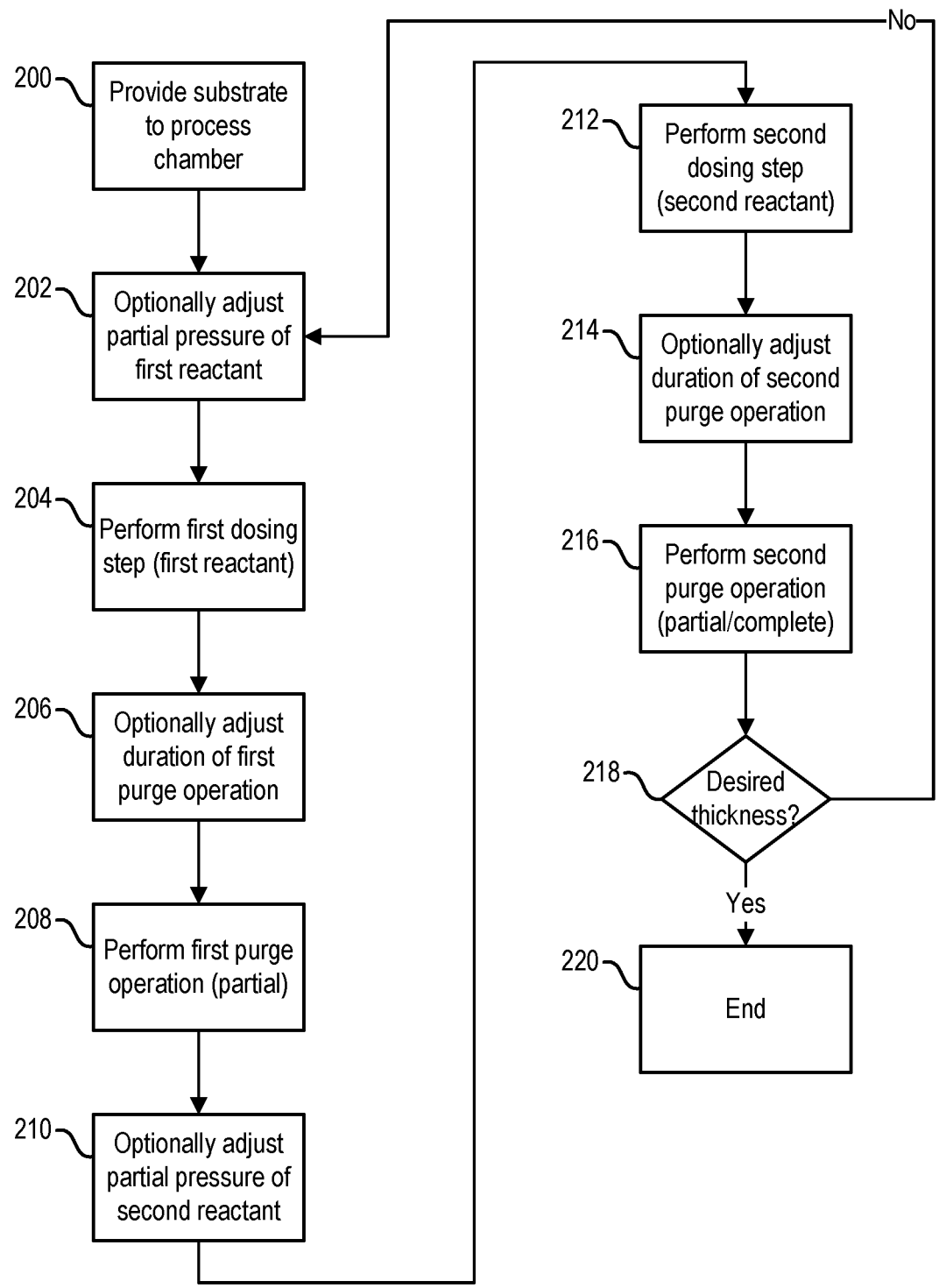
FIG. 2 illustrates a method for performing temporally pulsed CVD, in accordance with implementations of the disclosure.

FIG. 2 illustrates a method for performing temporally pulsed CVD, in accordance with implementations of the disclosure. At method operation 200, a substrate is provided to a process chamber in which deposition is carried out.

At method operation 202, optionally, settings for the partial pressure and/or the duration of flow of a first reactant are adjusted. In some implementations, the partial pressure can be adjusted by adjusting the flow rate of the first reactant into a carrier gas stream (e.g. an inert gas such as $N_2$, Ar, etc.) that is delivered to the process chamber. Thus, the partial pressure of the first reactant is its partial pressure when mixed with the carrier gas stream, the mixture being delivered to the process chamber. Additionally, a setting for the duration of time that the first reactant is flowed into the process chamber can be adjusted. It will be appreciated that the partial pressure and the duration of flow of the first reactant together will define the amount of first reactant that is delivered to the process chamber, and affect the amount of the first reactant that will diffuse into a gap feature on the substrate.

At method operation 204, the first dosing step is performed, in which the substrate is exposed to the first reactant in accordance with the settings defined above. That is, the first reactant is provided to the process chamber at the specified partial pressure and for the specified duration of time. It will be appreciated that the first reactant is one of the two reactants which can be utilized for an ALD deposition process, and therefore, the first reactant adsorbs onto the sidewalls and the bottom of the gap feature in a self-limiting fashion to form a single monolayer. Additional amounts of the first reactant will remain in the gas phase within the gap feature and over the field of the substrate.

At method operation 206, optionally, the duration and/or flow rate of a first purge operation are adjusted. The purge operation is effected by flowing an inert gas through the process chamber, and the duration and flow rate of the inert gas will determine the extent to which the first reactant is evacuated from the process chamber, and more specifically, from the gap feature. In some implementations, the purge operation is effected by simply maintaining the continuous flow of the carrier gas into the chamber at its designated flow rate, and in such implementations, the extent of the purge operation will be adjusted by adjusting the duration of the purge operation. Unlike a purge operation in a conventional ALD process, the parameters of the purge operation are specifically configured to provide for a partial or incomplete purge of the first reactant from the chamber, and more specifically from the gap feature of the substrate.

At method operation 208, the first purge operation is performed in accordance with the above-described settings. The first purge operation is specifically configured to effect a partial purge of the first reactant from the gap feature of the substrate. That is, some quantity of the first reactant is deliberately allowed to remain in the gap feature. During the course of the purge operation, the first reactant diffuses out of the gap feature. However, the kinetics of this diffusion are such that first reactant species at higher portions of the gap feature diffuse out of the gap feature more rapidly than species at lower portions of the gap feature. This results in the creation of a concentration gradient within the gap feature such that concentration of the first reactant in the gap feature increases with increasing depth in the gap feature.

It will be appreciated that the parameters of the first dosing step and the first purge operation will determine the extent and characteristics of the gradient of the first reactant remaining in the gap feature at the end of the first purge operation. The parameters of the dosing step are configured so that additional quantities of the first reactant remain in the gap feature in the gas phase, and the parameters of the first purge operation are configured to effect a sub-saturated purge that does not completely remove the first reactant, but allows an amount of the first reactant to remain in the gap feature in a concentration gradient that increases with increasing depth.

At method operation 210, optionally, the partial pressure and/or flow rate of a second reactant are adjusted. In some implementations, as with the first reactant, the partial pressure of the second reactant can be adjusted by adjusting the flow rate of the first reactant into the carrier gas stream as it is delivered to the process chamber. Thus, the partial pressure of the second reactant is its partial pressure when mixed with the carrier gas stream, the mixture being delivered to the process chamber. Additionally, a setting for the duration of time that the second reactant is flowed into the process chamber can be adjusted. It will be appreciated that the partial pressure and the duration of flow of the second reactant together will define the amount of second reactant that is delivered to the process chamber, and affect the amount of the second reactant that will diffuse into the gap feature on the substrate.

At method operation 212, the second dosing step is performed, in which the substrate is exposed to the second reactant in accordance with the settings defined above. That is, the second reactant is provided to the process chamber at the specified partial pressure and for the specified duration of time. It will be appreciated that the second reactant is the other of the two reactants which can be utilized for an ALD deposition process, and therefore, the second reactant reacts with the adsorbed first reactant along the sidewalls and the bottom of the gap feature to form a desired product.

However, as there are additional quantities of the first reactant remaining in the gas phase within the gap feature, the provided second reactant will also react with these additional quantities of the first reactant in a CVD mode of deposition, forming product in the gas phase that then adheres to nearby surfaces. As noted above, a concentration gradient of the first reactant exists in the gap feature, and therefore, greater amounts of this CVD mode of deposition will occur deeper in the gap feature as opposed to at shallower depths where fewer species of the first reactant are available in the gas phase. Thus, the extent of the CVD mode of deposition increases with increasing depth in the gap feature. This effects a higher deposition rate of product at increased depths in the gap feature.

At method operation 214, optionally, the duration and/or flow rate of a second purge operation are adjusted. As with the first purge operation, the second purge operation is effected by flowing an inert gas through the process chamber, and the duration and flow rate of the inert gas will determine the extent to which any remaining reactants or reaction byproducts are evacuated form the process chamber, and more specifically, from the gap feature. In some implementations, the second purge operation is effected by maintaining the continuous flow of the carrier gas into the chamber at its designated flow rate, and in such implementations, the extent of the purge operation will be adjusted by adjusting the duration of the purge operation.

In some implementations, the parameters of the second purge operation are configured to effect complete removal of any reactants (including unreacted amounts of the first or second reactant) or byproducts from the process chamber.

However in other implementations, the parameters of the second purge operation are specifically configured to provide for a partial or incomplete purge of the second reactant from the chamber, and more specifically from the gap feature of the substrate. In such implementations, and in a similar manner to the first reactant, remaining quantities of the second reactant in the gap feature are distributed along a concentration gradient that increases with increasing depth in the gap feature.

At method operation 216, the second purge operation is performed in accordance with the above-described settings. The second purge operation can be configured to effect a complete or partial purge of the gap feature of the substrate as noted.

In the latter case, some quantity of the second reactant is deliberately allowed to remain in the gap feature. When the deposition cycle defined by method operations 202 to 216 is repeated again, then upon performance of the first dosing step, the first reactant will be provided to the process chamber, and will react with the remaining species of the second reactant in the gas phase to produce the CVD mode of deposition again.

At method operation 218 it is determined whether a desired deposition thickness or amount has been achieved (e.g. complete gapfill or a predefined amount of gapfill being achieved), or whether a predefined number of deposition cycles has been performed. If not, then the method returns to method operation 202; if so, then at method operation 220, the method ends.

In accordance with implementations of the disclosure, the above-described process can be tuned for a deposition profile that provides increased deposition of the film with increasing depth in the gap feature. The result is a gap-fill process that provides a bottom-up filling of the gap feature. As the gap feature is filled from the bottom up in successive deposition cycles, the parameters of the deposition process can be further adjusted to tailor the deposition profile in a desired manner Thus, various stages of the gapfill can be deposited using specifically tuned parameters which, by way of example, may adjust the amount of deposition that is allowed to occur via the CVD mode. For example, in some implementations, the gapfill process is configured so that initially, greater amounts of deposition occur via the CVD mode, whereas at a later stage (e.g. after a predefined number of deposition cycles) the deposition process is configured to enable less deposition to occur via the CVD mode.

FIGS. 3A, 3B, 3C, and 3D conceptually illustrate the presence of first and second reactants in a gap feature of a substrate during the course of a temporally pulsed CVD deposition cycle, in accordance with implementations of the disclosure.

Figure 3A:
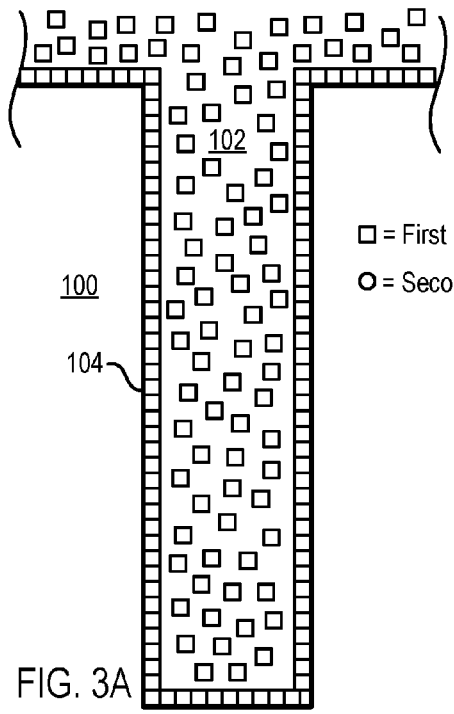
FIGS. 3A, 3B, 3C, and 3D conceptually illustrate the presence of first and second reactants in a gap feature of a substrate during the course of a temporally pulsed CVD deposition cycle, in accordance with implementations of the disclosure.

Shown at FIG. 3A is a cross-section view of a portion of a substrate 100 including a gap feature 102 (e.g. trench or hole). The gap feature 102 has a high aspect ratio (e.g. about 10:1 or greater in some implementations, about 20:1 or greater in some implementations, about 30:1 or greater in some implementations, etc.) with sidewalls 104. The first dosing step has been completed, in which the first reactant is dosed to the process chamber in which the substrate is disposed. As noted above, the first reactant can be one of a pair of reactants which can be used for ALD. Thus, the first reactant adsorbs onto the exposed surfaces of the substrate 100 in a self-limiting fashion. Also, as shown with continued reference to FIG. 3A, additional quantities of the first reactant are present in the gas phase in the gap feature 102. The first reactant is provided at a partial pressure and for a sufficient duration of time to enable the additional quantities of the first reactant to diffuse to the bottom of the gap feature 102 in a sufficient concentration to enable to pulsed CVD deposition mode to be induced as described herein.

Figure 3B:
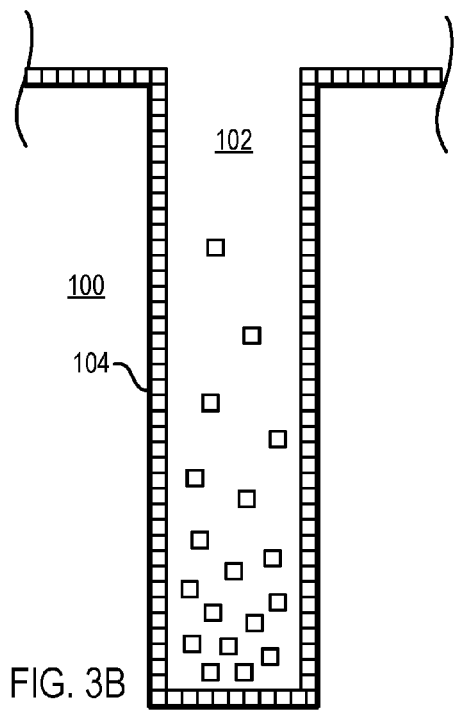

At FIG. 3B, the first purge operation has been performed, wherein the non-adsorbed first reactant species which are present in the gas phase, and any reaction byproducts, are purged from the process chamber by the flow of an inert gas. However, the first purge is specifically configured to be a sub-saturative partial purge that does not completely remove the first reactant species from the gap feature 102. Rather, some quantity of the first reactant remains in the gap feature at the completion of the first purge operation. Due to the diffusion kinetics, wherein species at the top of the gap feature are purged more quickly than species at the bottom, the first reactant species that are deliberately allowed to remain in the gap feature are distributed in a concentration gradient that increases with increasing depth in the gap feature.

Figure 3C:
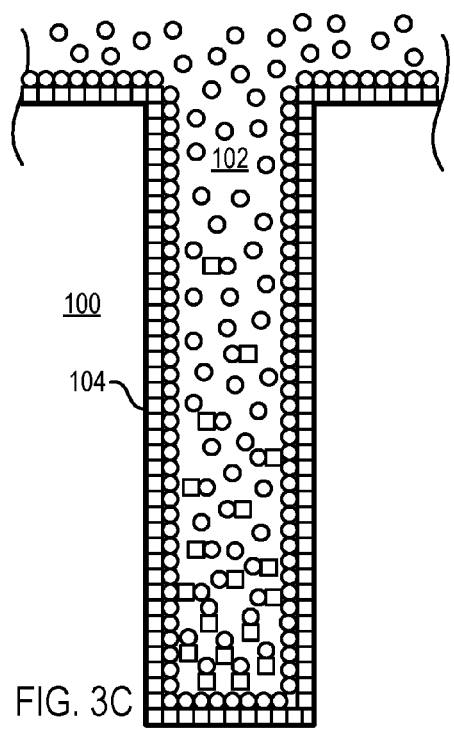

At FIG. 3C, the second dosing step is performed, wherein the second reactant of the reactant pair is provided to the process chamber. The second reactant is configured to react with the first reactant to form the desired product deposition material. The second reactant reacts with both the first reactant species which have adsorbed on the substrate surfaces, and with the first reactant species that are available in the gas phase. This latter reaction occurs primarily towards the bottom of the gap feature 102, due to the depth-dependent concentration gradient of the first reactant in the gap feature 102 following the first purge operation. The reaction of the second reactant with the gas phase first reactant species produces a CVD mode of deposition. As this CVD mode is induced to a greater extent at the bottom of the gap feature versus the top, the result is increased deposition rate with increasing depth in the gap feature 102, which enables bottom-up gapfill of the gap feature 102.

Figure 3D:
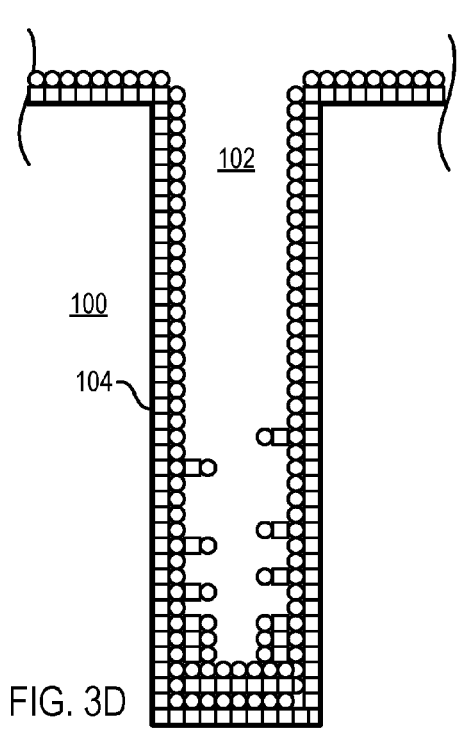

At FIG. 3D, the substrate portion is shown following performance of the second purge operation. In the illustrated implementation, the second purge operation is configured to effect complete purging of the substrate, such that any remaining reactants and/or reaction byproducts are removed. As can be seen, there has been greater deposition towards the bottom of the gap feature 102 as opposed to the top.

Though in the illustrated implementation, the second purge operation has been configured to effect a complete purge, in other implementations the second purge operation can be configured to effect a partial purge, such that a quantity of the second reactant is deliberately allowed to remain in the gap feature 102. Then during a subsequent first dosing step during the next deposition cycle, the first reactant will react with the remaining second reactant in the gas phase and produce another CVD deposition event in the gap feature 102. In a temporally pulsed CVD deposition using this type of configuration, there can be two distinct CVD deposition events for each complete cycle of the deposition process (after the first cycle). The CVD deposition events will correspond to each of the dosing steps in the cycle which are temporally separated in accordance with the described method. It will be appreciated that in such implementations, the CVD deposition mode may dominate at greater depth in the gap feature, whereas the ALD deposition mode may dominate at shallower depth in the gap feature.

Thus, by deliberately allowing either or both of the first and second reactants to remain in the gap feature following their corresponding purge operations, a CVD deposition mode can be induced that is specifically targeted to provide increased deposition rate with increased depth in the gap feature. Repeated deposition cycles will therefore provide for bottom-up gapfill without the need for additional process operations.

Figure 4:
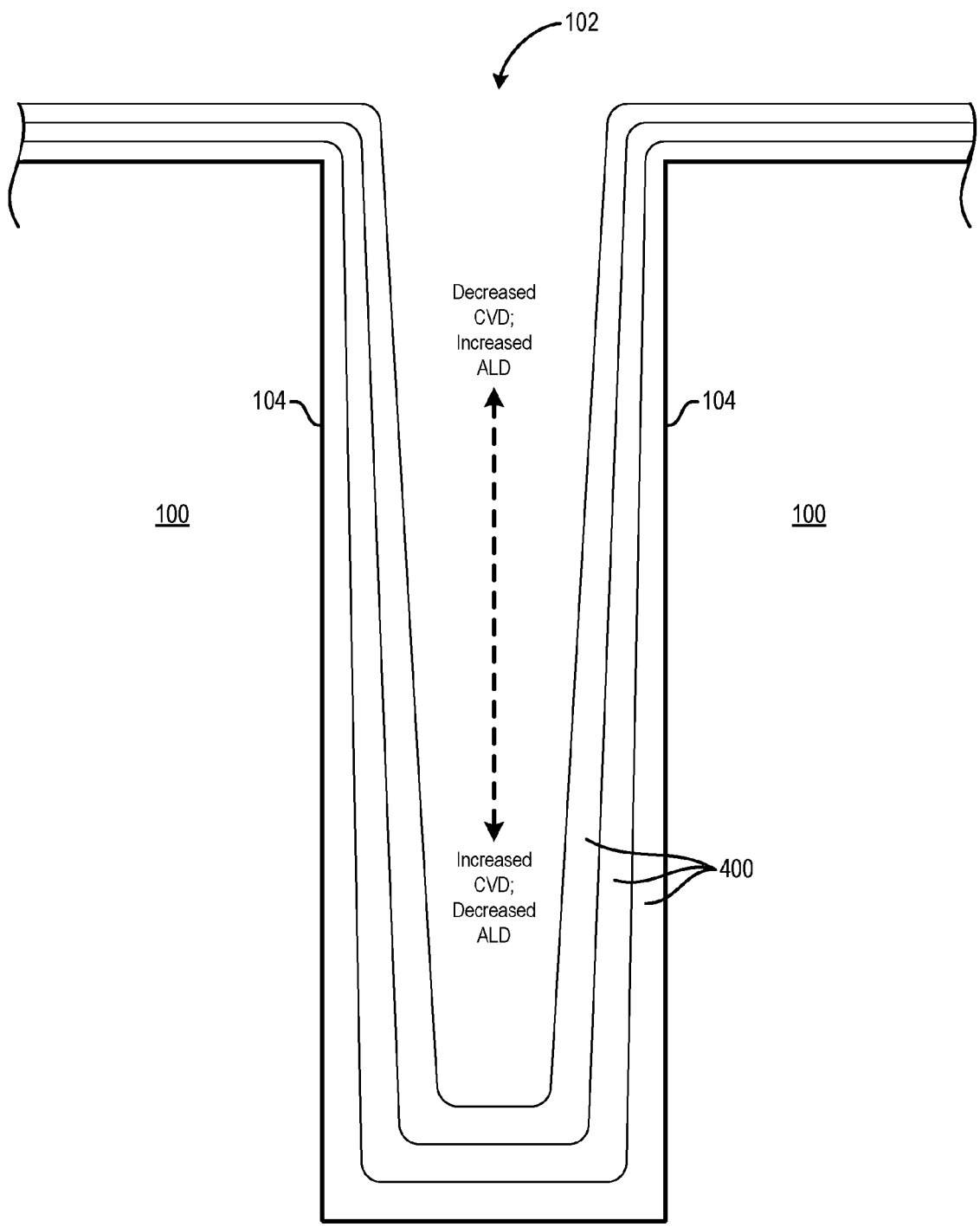
FIG. 4 conceptually illustrates deposition of various layers of material in a gapfill operation employing a temporally pulsed CVD deposition process, in accordance with implementations of the disclosure.

FIG. 4 conceptually illustrates deposition of various layers of material in a gapfill operation employing a temporally pulsed CVD deposition process, in accordance with implementations of the disclosure. A cross-section of a portion of the substrate 100 including the gap feature 102 is shown, with deposited layers 400 of gapfill material which have been deposited by successive deposition cycles in accordance with the temporally pulsed CVD process described herein. As discussed, the temporally pulsed CVD process enables CVD deposition modes to occur towards the bottom of the gap feature 102, resulting in a deposition profile providing for increased deposition rate with increasing depth in the gap feature. This is conceptually shown in the illustrated implementation, as the deposited layers 400 exhibit thicker deposition at the bottom of the gap feature 102 versus the top. The deposition thickness along the sidewalls 104 of the gap feature increases with increasing depth.

As noted, at greater depth in the gap feature there may be increased deposition via the CVD mode versus the ALD mode, whereas at shallower depth there may be decreased deposition via the CVD mode versus the ALD mode. In some implementations, the CVD mode dominates at greater depth whereas the ALD mode dominates at shallower depth.

Figure 5:
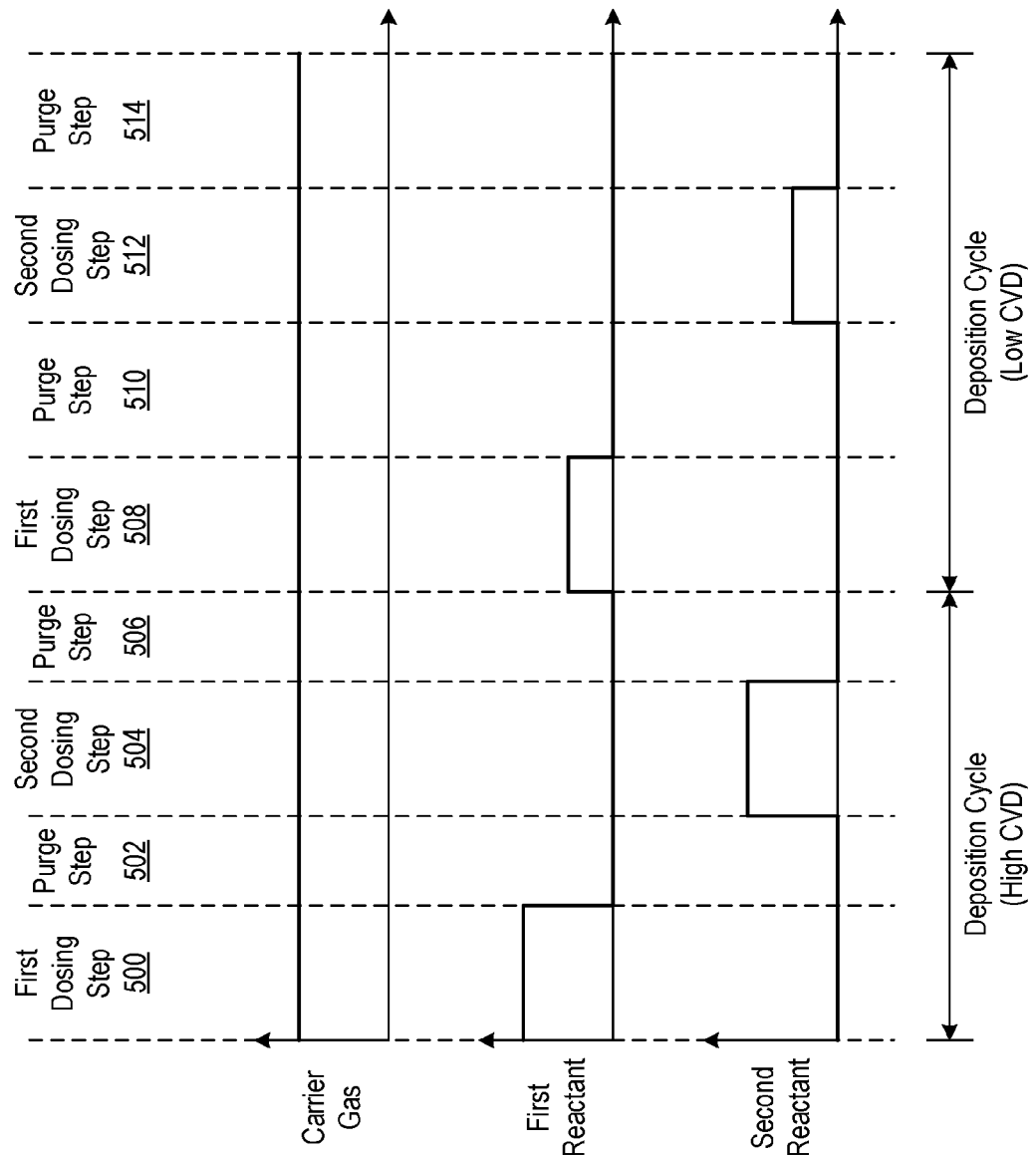
FIG. 5 is a timing sequence diagram illustrating flow/pulses of gas into a process chamber during performance of operations for a temporally pulsed CVD process, in accordance with implementations of the disclosure.

FIG. 5 is a timing sequence diagram illustrating flow/pulses of gas into a process chamber during performance of operations for a temporally pulsed CVD process, in accordance with implementations of the disclosure. The various curves indicate when the flow of a given gas is turned on or off, so as to define various phases of the deposition process. In the illustrated implementation, a complete deposition cycle providing for a greater CVD mode (and possibly lesser ALD mode) is shown, followed by a complete deposition cycle providing for a comparatively lesser CVD mode (and possibly comparatively greater ALD mode). The high CVD deposition cycle providing for greater CVD includes phases 500, 502, 504, and 506. At phase 500, a first dosing step is defined for which the flow of the carrier gas and the first reactant are simultaneously turned on. During phase 502, a purge step is defined wherein the flow of the first reactant is turned off, allowing the chamber to be purged by the continuing flow of the carrier gas. During phase 504, a second dosing step is defined wherein the flow of the second reactant is turned on, so as to mix with the continuing flow of the carrier gas. During phase 506, another purge step is defined wherein the flow of the second reactant is turned off, again allowing the continuing flow of the carrier gas to purge the chamber.

The high CVD deposition cycle defined by phases 500, 502, 504, and 506, can be repeated for a predefined number of times so as to achieve a desired deposition thickness. For example, in some implementations, the high CVD deposition cycle is repeated until a gap feature is approximately 50 to 80% filled, as measured from the bottom of the gap feature; in some implementations, the high CVD deposition cycle is repeated until the gap feature is approximately 70% to 80% filled; in some implementations, the high CVD deposition cycle is repeated until the gap feature is approximately 75% filled. It will be appreciated that parameters such as the partial pressures of the reactants and the durations of the dosing and purge steps can be tuned to provide a desired deposition profile.

Also shown with continued reference to FIG. 4 is the low CVD deposition cycle providing for less CVD (as compared to the high CVD deposition cycle), which includes phases 508, 510, 512, and 514. At phase 508, a first dosing step is defined for which the flow of the carrier gas and the first reactant are simultaneously turned on. During phase 510, a purge step is defined wherein the flow of the first reactant is turned off, allowing the chamber to be purged by the continuing flow of the carrier gas. During phase 512, a second dosing step is defined wherein the flow of the second reactant is turned on. During phase 514, another purge step is defined wherein the flow of the second reactant is turned off, again allowing the continuing flow of the carrier gas to purge the chamber.

The low CVD deposition cycle defined by phases 508, 510, 512, and 514, can be repeated for a predefined number of times so as to achieve a desired deposition thickness. In some implementations, the low CVD deposition cycle is repeated (at least) until the gap feature is completely filled.

With continued reference to FIG. 5, differences in the parameters of the high CVD and low CVD deposition cycles are illustrated, highlighting the effect of modulating the deposition parameters to affect the relative amount of CVD (and in some implementations, the relative amount of ALD) that occurs during each deposition cycle. For example, during the dosing steps, the partial pressures of the first and second reactants are higher in the high CVD deposition cycle than in the low CVD deposition. Also, the durations of the purge steps in the high CVD deposition cycle are shorter than in the low CVD deposition cycle. The higher partial pressures and shorter purge durations of the high CVD deposition cycle both contribute to provide for greater amounts of the first or second reactants to remain in the gap feature in the gas phase at completion of the ensuing purge step, which enables greater amounts of deposition by the CVD mode during the next dosing step. Whereas the comparatively lower partial pressures and longer purge durations of the low CVD deposition cycle both contribute to provide for lesser amounts of the first or second reactants to remain in the gap feature in the gas phase at completion of the ensuing purge step, which enables lesser amounts of deposition by the CVD mode during the next dosing step (and possibly greater amounts of deposition by ALD, especially at the bottom of the gap feature).

Figure 6:
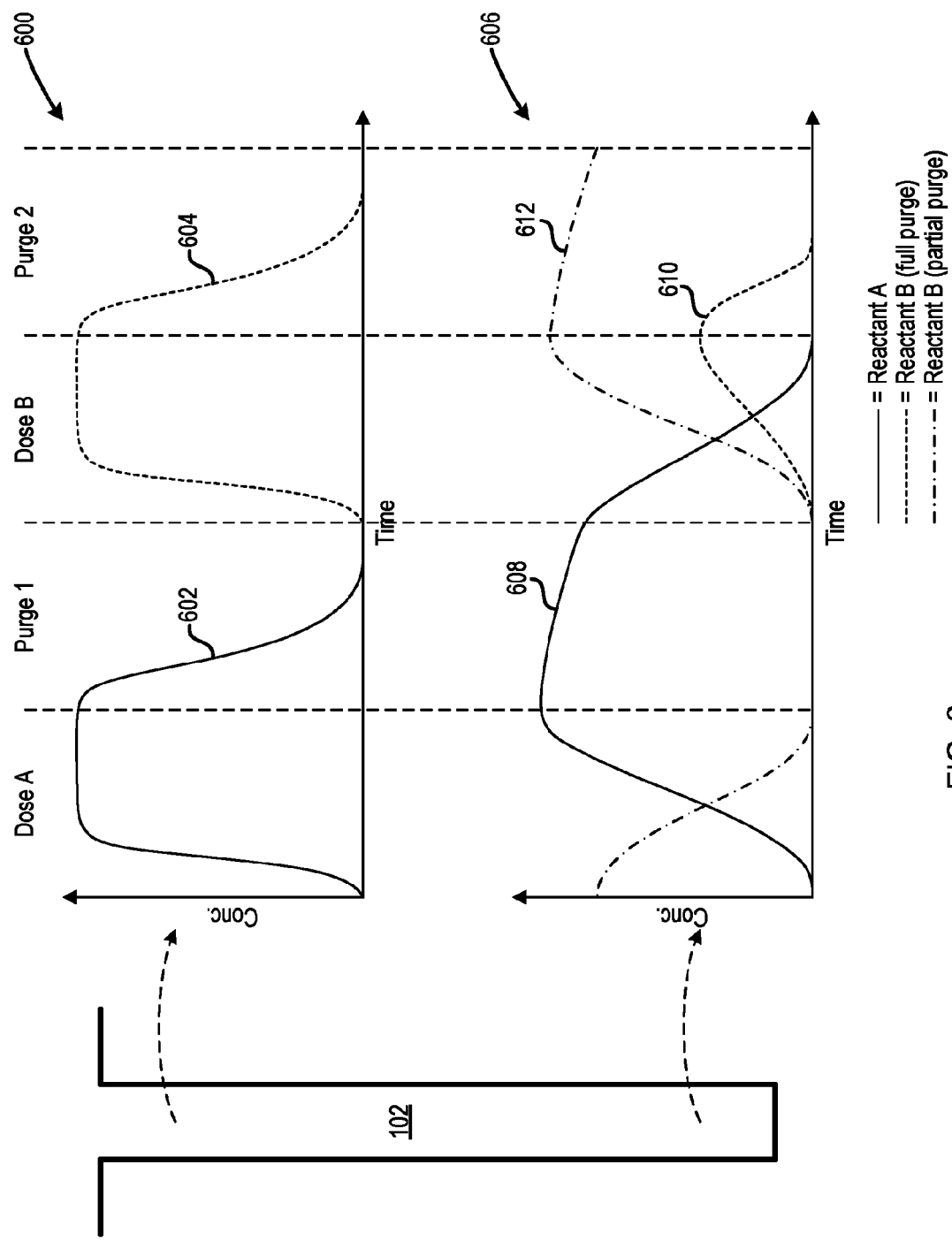
FIG. 6 illustrates a pair of graphs showing concentrations of reactants at different depths in a gap feature during a temporally pulsed CVD cycle, in accordance with implementations of the disclosure.

FIG. 6 illustrates a pair of graphs showing concentrations of reactants at different depths in a gap feature during a temporally pulsed CVD cycle, in accordance with implementations of the disclosure.

The graph 600 shows the concentrations of the first reactant and the second reactant over time at a location at or near the top of the gap feature 102. The curve 602 illustrates the concentration of the first reactant A. As shown, during the first dosing step, the concentration of reactant A increases rapidly until a saturation limit is reached, and during the ensuing purge step, the concentration of reactant A also decreases rapidly (e.g. to zero or near-zero levels).

The curve 604 illustrates the concentration of the second reactant B. As shown, during the second dosing step, the concentration of reactant B increases rapidly until a saturation limit is reached, and during the ensuing purge step, the concentration of reactant B also decreases rapidly (e.g. to zero or near-zero levels).

The graph 606 shows the concentrations of the first reactant and the second reactant over time at a location at or near the bottom of the gap feature 102. The curve 608 illustrates the concentration of the first reactant A. As shown, during the first dosing step, the concentration of reactant A increases, but at a comparatively slower rate than at the top of the gap feature. During the ensuing purge step, the concentration of reactant A decreases, but at a slower rate and to a lesser extent than at the top of the gap feature, so that at the end of the purge step, there still remains a significant concentration of the first reactant at the bottom of the gap feature. During the second dosing step, as the second reactant B is supplied, the concentration of the reactant A diminishes as it is consumed by reaction with the reactant B.

The curve 610 shows the concentration of the reactant B at the bottom of the gap feature, which increases at a slower rate as compared to at the top of the gap feature. It will be appreciated that the concentration of the reactant B at the bottom of the gap feature may be affected (reduced) by its consumption through reaction with reactant A at the bottom of the gap feature. During the ensuing purge operation, a complete purge is effected, reducing the concentration of the second reactant to zero at the bottom of the gap feature.

In an alternative implementation, the concentration of the reactant B at the bottom of the gap feature is shown by the curve 612. The concentration of the reactant B is enabled to increase to a sufficient level and a partial purge step is configured so that the concentration of the reactant B at the bottom is not reduced to the same extent as at the top of the gap feature. Thus, a quantity of the reactant B remains after completion of the second purge operation, and during the next deposition cycle at the ensuing first dosing step, the first reactant is again provided which reacts with the available second reactant at the bottom of the gap feature, thereby consuming it and reducing its concentration as indicated.

As the gap feature is filled by successive ALD cycles, the overall depth of the gap feature decreases. In some implementations, as the depth decreases, so the partial pressure of the first reactant and/or the second reactant is also decreased, and/or so the duration of one or both of the purge steps is increased. In some implementations, when the depth decreases to a predefined level, or after a predefined number of deposition cycles under a given set of parameters, then the parameters are adjusted in such a manner to effect reduced CVD modes, and possibly greater ALD modes.

It will be appreciated that the presently described method for performing temporally pulsed CVD can be utilized for deposition of any material for which suitable reactants exist, and can be tuned to enable gap-fill deposition of such material in high aspect ratio gap features that avoids formation of a void and/or a seam. In the following description, examples of possible materials that may be deposited in accordance with the presently described method are provided by way of example, without limitation.

Examples of materials that may be deposited using the presently described temporally pulsed CVD process include the body of materials which may traditionally be deposited by ALD, include various elemental materials (e.g. C, Al, Si, Ti, Fe, Co, Ni, Cu, Zn, Ga, Ge, Mo, Ru, Rh, Pd, Ag, Ta, W, Os, Ir, Pt), oxides (e.g. oxides of any of the following: Li, Be, B, Mg, Al, Si, P, Ca, Sc, Ti, V, Cr, Mn, Fe, Co, Ni, Cu, Zn, Ga, Ge, Sr, Y, Zr, Nb, Ru, Rh, Pd, In, Sn, Sb, Ba, La, Ce, Pr, Nd, Sm, Eu, Gd, Tb, Dy, Ho, Er, Tm, Yb, Lu, Hf, W, Ir, Pt, Pb, Bi), nitrides (e.g. nitrides of any of the following: B, Al, Si, Ti, Cu, Ga, Zr, Nb, Mo, In, Hf, Ta, W), sulfides (e.g. sulfides of any of the following: Ca, Ti, Mn, Cu, Zn, Sr, Y, Cd, In, Sn, Sb, Ba, La, W), carbides, halides, etc.

It will be appreciated that the presently described implementations can be applied using the available reactants for ALD processes as are known in the art, to provide for bottom-up gapfill of a gap feature. Various examples of reactants which are commonly utilized for ALD, and for which the present implementations may be applied, include inorganic reactants such as elemental and metal halides, and metal organic compounds such as alkyls, cyclopentadienyls, alkoxides, β-diketonates, amides, silyls and amidinates. These are commonly employed as first reactants or precursors within the context of the ALD sequence. Various second reactants (or co-reactants) may include $O_2$, $N_2$, $NH_3$, etc., which are pulsed during the second dosing step.

In some implementations, the first reactant in the first half-reaction is a molecular precursor for a desired film material, and the second reactant in the second half-reaction is configured to convert the adsorbed precursor to the desired film material. The second reactant may be a plasma in some implementations. In some implementations, the second reactant is configured to convert the adsorbed precursor to an oxide (e.g. using $O_3$, $H_2O$, $O_2$ plasma, etc.). In some implementations, the second reactant is configured to convert the precursor to a nitride (e.g. using $N_2$ plasma, $NH_3$ plasma, etc.).

One deposition material of interest is silicon dioxide ($SiO_2$). Deposition of a high quality silicon oxide (such as ($SiO_2$) is useful in various applications, such as formation of a shallow trench insulator (STI), pre-metal dielectric, 3D NAND, deep trenches, etc. Examples of $SiO_2$ precursors include diisopropylaminosilane (DIPAS), bis(diethylamine) silane (BDEAS), bis(tertiary-butylamino)silane (BTBAS), $SiH_2DMA_2$, etc. Various oxidants can be utilized to convert the $SiO_2$ precursor, including $O_2$, $N_2O$, $CO_2$, etc.

The foregoing examples for silicon oxide deposition are provided by way of example only, without limitation, as the principles of the present implementations can be applied to any set of reactants that can be configured to provide for deposition in accordance with the methods described herein. The partial pressures of such reactants, as well as the flow rates and times of their delivery along with those of the purge steps, can be tuned for enable bottom-up gapfill. Furthermore, as partial pressures of different molecules are variously affected by temperature, so the temperature can also be controlled to provide for desired partial pressures of the reactants.

Various dielectrics can be deposited using temporally pulsed CVD processes, including oxides, nitrides, carbides, halides, etc. Various metal centers of such dielectrics include Si, Al, Hf, Zr, Ti Mg, Mn etc. and can encompass all M1, M2, M3, M4 and transition metal oxides. Various precursors of (e.g. metal organics, halides, etc.) of the foregoing metal centers can be utilized, and various co-reactants can include $O_2$, $N_2O$, $NH_3$, etc.

Furthermore, various methods of reaction activation via plasma can be utilized, including capacitively coupled plasma (CCP), inductively-coupled plasma (ICP) and remote plasma.

A metric for efficiency of bottom-up seamless fill can be conceived as follows: T=Trench Bottom Growth Rate/Sidewall Growth Rate. For a pair of reactants A and B as the first and second reactants respectively, a 3D temporally-pulsed CVD process space can be determined where T can be plotted as a function of ($P_A/P_B$; $f_{purge1}t_{purge1}$; $f_{purge2}t_{purge2}$), wherein (1) $P_A/P_B$ is a ratio of the partial pressures of the first and second reactants, (2) $f_{purge1}t_{purge1}$ is the sub-saturative purge efficiency of the purge step after the first reactant dose, wherein f denotes flow and t denotes time, and (3) $f_{purge2}t_{purge2}$ is the sub-saturative purge efficiency of the purge step after the second reactant dose.

Figure 7:
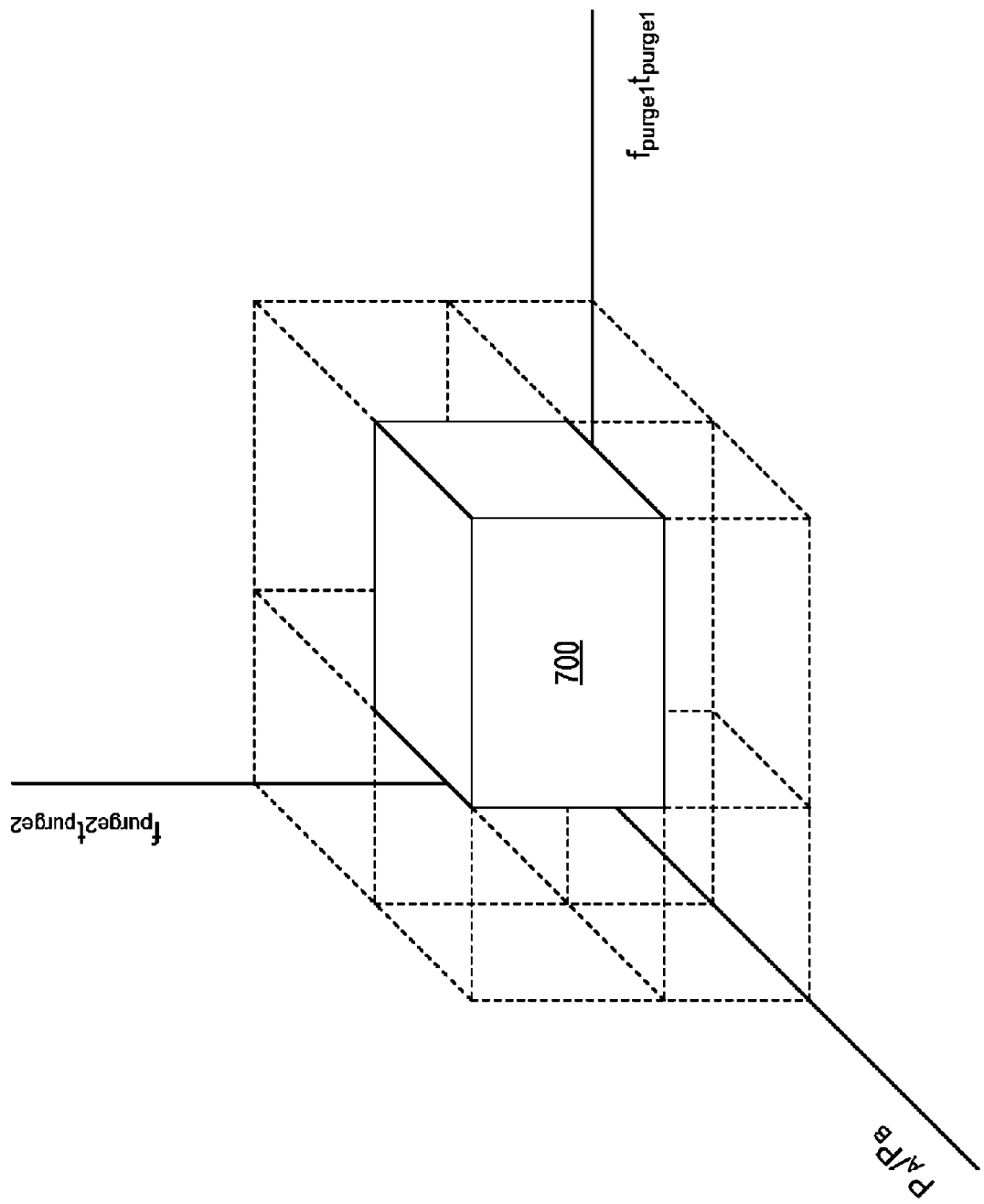
FIG. 7 is a 3D graph illustrating a 3D process space determined as a function of ($P_A/P_B$; $f_{purge1}t_{purge1}$; $f_{purge2}t_{purge2}$), in accordance with implementations of the disclosure.

FIG. 7 is a 3D graph illustrating a 3D process space determined as a function of ($P_A/P_B$; $f_{purge1}t_{purge1}$; $f_{purge2}t_{purge2}$), in accordance with implementations of the disclosure. The 3D process space 700 as shown is a process space wherein the parameters provide for temporally pulsed CVD, wherein temporally separated dosing of the reactants is configured to enable CVD modes to occur in a depth-dependent manner in gap features of a substrate, as has been described.

In some implementations, the first reactant is a silicon dioxide precursor such as DIPAS, and the second reactant is an oxidant such as oxygen plasma. In this case, the ratio of the partial pressures can be expressed as $P_{DIPAS}/P_{Oradical}$, and the process space determined according to the values of T as a function of ($P_{DIPAS}/P_{Oradical}$; $f_{purge1}t_{purge1}$; $f_{purge2}t_{purge2}$).

As noted, the presently described methods for performing temporally pulsed CVD operate through careful control of temporally separated reactant additions to facilitate co-reactant CVD modes within the temporal separation sequence. These process operations can be configured to take advantage of Langmuirian kinetics with respect to the surface versus gas phase interactions. To achieve CVD modes in a temporally separated dosing scheme, a short (by comparison to ALD processes) sub-saturative purge is employed (e.g. about 0.1 seconds in some implementations). The short purge time allows for CVD modes to instantiate.

By way of comparison, for a pure ALD process, a purge time of about 0.3 seconds or more is typically required.

One example of a reactant pair used to deposit silicon dioxide is DIPAS and $O_2$. Because these reactants have different molecular weights they have different pressure drops through the trench since diffusivity is inversely proportional to molecular weight.

Therefore, in accordance with some implementations, the partial pressure of $O_2$ is configured to be less than the partial pressure of DIPAS. The specific partial pressures can be chosen to provide for saturated growth rate at the bottom of the gap feature to enable bottom-up gapfill. The saturated growth rate can be achieved with comparatively high amounts DIPAS and low amounts of $O_2$. In some implementations, high amounts of DIPAS can be achieved through low dilution (lower carrier gas flow) and/or a high precursor ampoule temp (to increase the rate of vaporization). Low $O_2$ can be achieved by adjusting the mass flow controller that controls the flow of $O_2$ to a low level.

With reference to TABLE I below, example process conditions are provided for temporally pulsed CVD processes using DIPAS and $O_2$ as co-reactants, in accordance with implementations of the disclosure.

TABLE I

| Process | Precursor Ampoule temp (C.) | Precursor flow rate at temp (sccm) | Precursor Dilution/ Push Ar Flow (sccm) | Dose | Post-dose purge time (s) | RF Plasma ON Time | RF Plasma $O_2$ Flow (sccm) | RF Plasma Ar Flow (sccm) | Power (W) | Pressure (torr) | Post-RF purge time (s) |
|---|---|---|---|---|---|---|---|---|---|---|---|
| A (Control) | 30 | 350 | 1000 | 0.1-0.4 s | <0.1 s | 0.1-01 s | <1500 | 5000-18000 | 900 | 0.5-5 Torr | <0.1 |
| B (Low $O_2$:DIPAS ratio + Low dilution/push flow) | 30 | 450 | <500 | 0.1-0.4 s | <0.1 s | 0.1-0.5 s | <1500 | 5000-18000 | 900 | 0.5-5 Torr | <0.1 |
| C (Low $O_2$:DIPAS ratio + High ampoule temperature) | 45 | >700 | 250-1000 | 0.1-0.4 s | <0.1 s | 0.1-0.5 s | <1500 | 5000-18000 | 900 | 0.5-5 Torr | <0.1 |

For the processes of TABLE I, deposition of silicon dioxide is performed using DIPAS as a first reactant (silicon-containing molecular precursor for silicon dioxide) and $O_2$ as a second reactant, which is converted to a plasma under the application of RF power. The example processes take place in a Vector® deposition system, manufactured by Lam Research Corporation. As shown, various example parameters of the deposition system are provided for deposition of silicon dioxide.

Process A uses parameters similar to an existing ALD process, but with the notable exception of the purge times being significantly shorter. As discussed above, a short purge time can enable CVD modes to develop using the precursor remaining at the bottom of the gap feature to provide for bottom-up gapfill.

Process B differs from Process A in that the precursor flow rate is increased and the precursor dilution (as determined by the flow rate of the carrier gas used to "push" the precursor into the process chamber) is reduced. Both of these changes are designed to increase the amount of DIPAS supplied to the chamber, so as the maximize growth rate. Additionally, the range of the RF plasma ON time for Process B is limited to a shorter duration as compared to Process A.

Process C differs from Process B in that the precursor ampoule temperature is increased, so as to increase vaporization of the precursor, and the flow rate of the precursor is also increased. Again, these parameters are configured to provide for high amounts of DIPAS so as to saturate the growth rate at the bottom of the gap feature.

The partial pressure of the precursor (DIPAS) that is provided to the process chamber is determined by the precursor ampoule temperature (which affects the vaporization of the precursor) and the precursor flow rate. The partial pressure of the reactant ($O_2$) is determined by its flow rate.

In some implementations, the partial pressure of the precursor (DIPAS) is in the range of approximately 0.1 to 10 Torr, or in some implementations, a range of about 1 to 6 Torr, or in some implementations, a range of approximately 1.5 to 2.5 Torr.

In some implementations, the partial pressure of the reactant ($O_2$) is in the range of approximately 0.1 to 10 Torr, or in some implementations, a range of about 1.5 to 4 Torr, or in some implementations, a range of approximately 1.8 to 2.5 Torr.

It is further noted that the RF Plasma Ar Flow indicated in TABLE I is also utilized for both of the purge operations.

In some implementations, the post-dose purge time is in the range of approximately 0.001 to 0.15 seconds, or in some implementations, a range of about 0.01 to 0.1 seconds, or in some implementations, a range of approximately 0.05 to 0.1 seconds.

In some implementations, the post-RF purge time is in the range of approximately 0.001 to 0.15 seconds, or in some implementations, a range of about 0.01 to 0.1 seconds, or in some implementations, a range of approximately 0.05 to 0.1 seconds.

Though specific values (including values expressing upper and lower bounds of a range) for various process variables have been recited in the present disclosure, it should be appreciated that these are provided by way of example for purposes of demonstrating certain implementations in accordance with the principles of the present disclosure. It should be appreciated that in other implementations any of these values may vary by approximately +/−10%. In other implementations, any of these values may be varied by approximately +/−20%. In still other implementations, the values of the various process variables may be configured as needed to achieve results consistent with the principles of the present disclosure.

Figure 8:
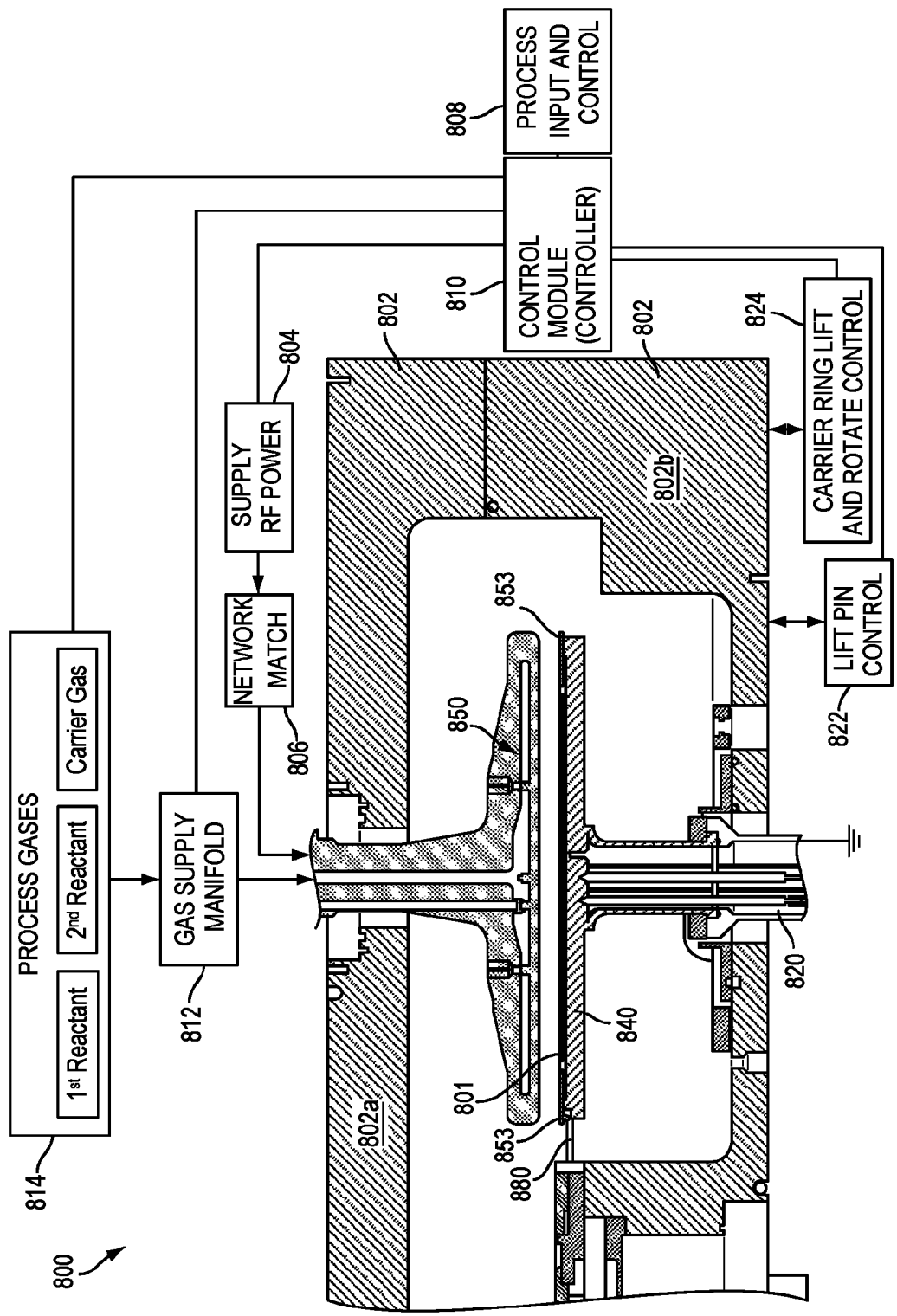
FIG. 8 illustrates a substrate processing system, which may be used to perform a temporally pulsed CVD process on a substrate, in accordance with implementations of the disclosure.

FIG. 8 illustrates a substrate processing system 800, which may be used to perform an ALD or CVD process on a substrate 801. The system of FIG. 8 includes a chamber 802 having a lower chamber portion 802b and an upper chamber portion 802a. A center column is configured to support a pedestal 840, which in one embodiment is a powered electrode. The control module 810 is configured to operate the substrate processing system 800 by executing process input and control 808. The process input and control 808 may include process recipes, such as power levels, timing parameters, shuttle speed, RF power levels, ground settings, process gases, flow rates, mechanical movement of the substrate 801, etc., such as for ALD or CVD film deposition over the substrate 801.

The center column is also shown to include lift pins 820, which are controlled by lift pin control 822. The lift pins 820 are used to raise the substrate 801 from the pedestal 840 to allow an end-effector to pick the substrate and to lower the substrate 801 after being placed by the end-effector. The substrate processing system 800 further includes a gas supply manifold 812 that is connected to process gases 814, e.g., gas chemistry supplies from a facility. Depending on the processing being performed, the control module 810 controls the delivery of process gases 814 (e.g. by opening or closing one or more valves) via the gas supply manifold 812. The chosen gases are then flowed into the shower head 850 and distributed in a space volume defined between the showerhead 850 face which faces the substrate 801 and the substrate 801 resting over the pedestal 840. In various processes, the gases can be reactants chosen for adsorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 853 that encircles an outer region of the pedestal 840. The carrier ring 853 is configured to sit over a carrier ring support region that is a step down from a substrate support region in the center of the pedestal 840. The carrier ring includes an outer edge side of its disk structure, e.g., outer radius, and a substrate edge side of its disk structure, e.g., inner radius, that is closest to where the substrate 801 sits. The substrate edge side of the carrier ring includes a plurality of contact support structures which are configured to lift the substrate 801 when the carrier ring 853 is lifted by forks 880. The carrier ring 853 is therefore lifted along with the substrate 801 and can be rotated to another station, e.g., in a multi-station system. In other embodiments, the chamber is a single station chamber. In still other embodiments, the chamber is part of a spatial ALD/CVD deposition chamber which includes a shuttle and an edge ring. The edge ring may also be referred to as a focus ring, depending on the implementation.

In some implementations, the chamber is configured to enable plasma enhanced ALD/CVD (PEALD/PECVD). In some implementations, the showerhead 850 is electrically coupled to power supply 804 (e.g., RF power source) via a match network 806, and the pedestal 840 is grounded, or vice versa. The power supply 804 may be defined from a single generator having two or more selectable and mutually exclusive oscillators. The power supply 804 is controlled by the control module 810. RF power is supplied to an electrode of the chamber so that a plasma can be generated for deposition. In the case of a spatial ALD/CVD chamber, the RF power source is coupled to the shuttle, which moves the substrate from process zone to process zone to complete one or more film deposition steps.

Figure 9:
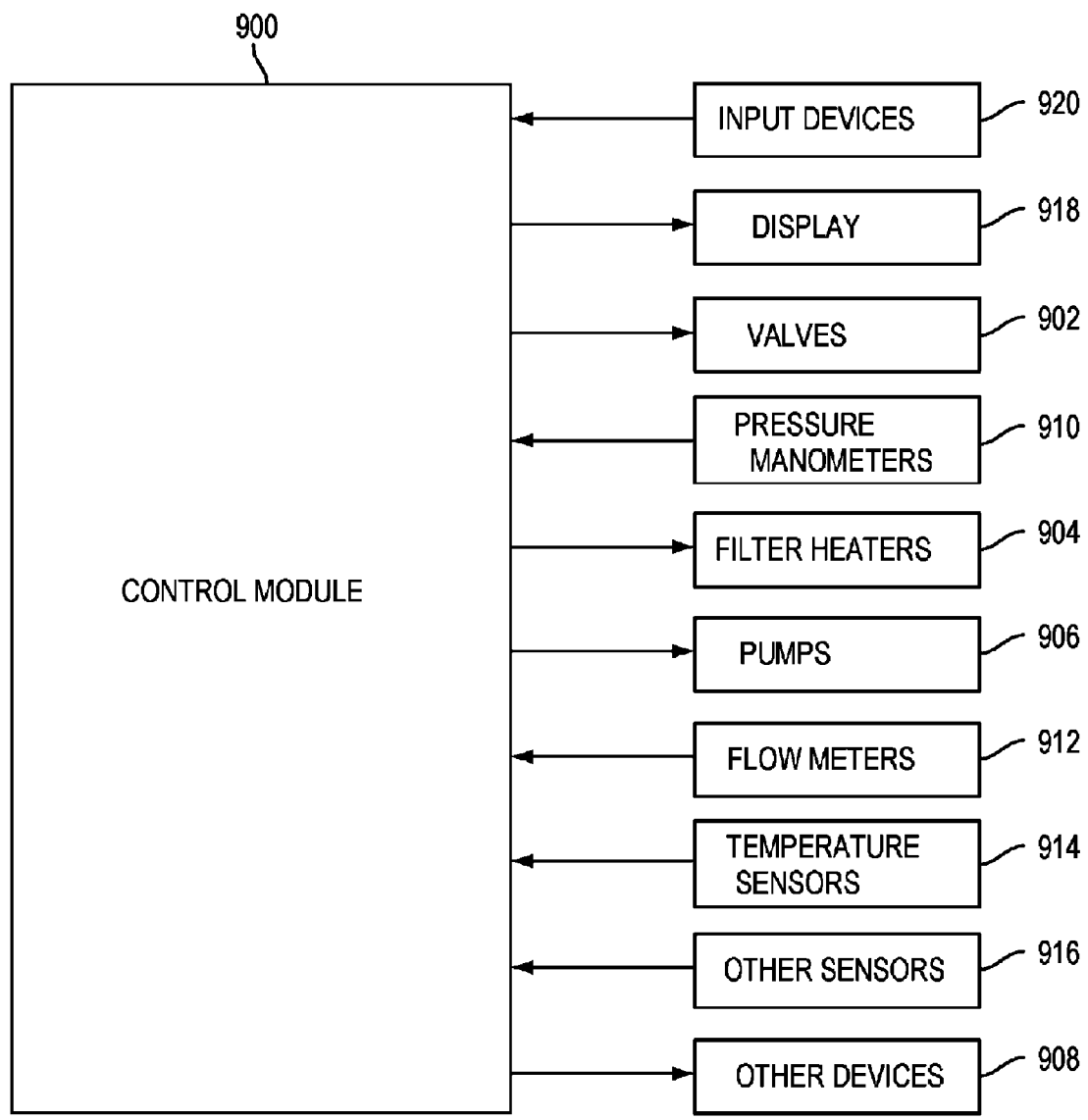
FIG. 9 shows a control module for controlling the systems of the present disclosure.

FIG. 9 shows a control module 900 for controlling the systems described above. For instance, the control module 900 may include a processor, memory and one or more interfaces. The control module 900 may be employed to control devices in the system based in part on sensed values. For example only, the control module 900 may control one or more of valves 902, filter heaters 904, pumps 906, and other devices 908 based on the sensed values and other control parameters. The control module 900 receives the sensed values from, for example only, pressure manometers 910, flow meters 912, temperature sensors 914, and/or other sensors 916. The control module 900 may also be employed to control process conditions during precursor delivery and deposition of the film. The control module 900 will typically include one or more memory devices and one or more processors.

The control module 900 may control activities of the precursor delivery system and deposition apparatus. The control module 900 executes computer programs including sets of instructions for controlling process timing, delivery system temperature, pressure differentials across the filters, valve positions, mixture of gases, chamber pressure, chamber temperature, substrate temperature, RF power levels, substrate chuck or pedestal position, and other parameters of a particular process. The control module 900 may also monitor the pressure differential and automatically switch vapor precursor delivery from one or more paths to one or more other paths. Other computer programs stored on memory devices associated with the control module 900 may be employed in some embodiments.

Typically there will be a user interface associated with the control module 900. The user interface may include a display 918 (e.g. a display screen and/or graphical software displays of the apparatus and/or process conditions), and user input devices 920 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 910, and thermocouples located in delivery system, the pedestal or chuck (e.g. the temperature sensors 914). Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of process gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method for performing temporally pulsed chemical vapor deposition (CVD) on a substrate, comprising:
providing a first reactant to a process chamber in which the substrate is disposed, the first reactant being configured to adsorb on exposed surfaces of the substrate in a self-limiting manner, the first reactant being provided at a partial pressure so that the first reactant diffuses into a gap feature of the substrate;
performing a first purge operation, the first purge operation being configured to partially purge gas phase first reactant species, that were not adsorbed, from the process chamber, wherein the first purge operation does not completely remove the gas phase first reactant species from the gap feature, so that a portion of the gas phase first reactant species remains in the gap feature;
providing a second reactant to the process chamber, the second reactant being configured to react with the first reactant to form a film product, including reaction of the provided second reactant with the adsorbed first reactant species, and reaction of the provided second reactant with the gas phase first reactant species in the gap feature;
performing a second purge operation, the second purge operation being configured to partially purge unreacted second reactant species, that did not react with the first reactant, from the process chamber, wherein the second purge operation does not completely remove the unreacted second reactant species from the gap feature, so that a portion of the unreacted second reactant species remains in the gap feature.

2. The method of claim 1, wherein the gas phase first reactant species remaining in the gap feature following the first purge operation are distributed along a concentration gradient such that the concentration of the gas phase first reactant species increases with increasing depth in the gap feature.

3. The method of claim 1, wherein the method provides for increased deposition rate of the film product with increased depth in the gap feature.

4. The method of claim 1, wherein the reaction of the provided second reactant with adsorbed first reactant species forms the film product on the surfaces on which the first reactant has adsorbed, and wherein the reaction of the provided second reactant with the gas phase first reactant species in the gap feature forms the film product in the gas phase, the film product formed in the gas phase being subsequently deposited on a surface of the gap feature.

5. The method of claim 1, wherein the second reactant is provided at a partial pressure that is less than the partial pressure of the first reactant.

6. The method of claim 5, wherein a temperature of the process chamber is controlled to provide for the partial pressures of the first reactant and the second reactant.

7. The method of claim 1, further comprising:
repeating the operations of the method for a predefined number of cycles so as to deposit multiple layers of the film product, wherein a deposition amount of the film product in the gap feature increases with increasing depth in the gap feature.

8. The method of claim 1,
wherein exposing the substrate to the first reactant includes pulsing the first reactant into a carrier gas stream that is flowed into the process chamber in which the substrate is disposed;
wherein exposing the substrate to the second reactant includes, pulsing the second reactant into the carrier gas stream.

9. The method of claim 8,
wherein performing the first purge operation includes continuing the flow of the carrier gas stream through the process chamber and evacuating the process chamber;
wherein performing the second purge operation includes continuing the flow of the carrier gas stream through the process chamber and evacuating the process chamber.

10. The method of claim 1,
wherein the film product is an oxide of silicon; and
wherein the first reactant is a silicon-containing precursor.

11. The method of claim 10, wherein the first reactant is diisopropylaminosilane (DIPAS), bis(diethylamine)silane (BDEAS) or bis(tertiarybuthylamine)silane (BTBAS).

12. The method of claim 11, wherein the second reactant is oxygen.

13. The method of claim 12,
wherein the first reactant is provided at a partial pressure in the range of approximately 0.1 to 10 Torr;
wherein the second reactant is provided at a partial pressure in the range of approximately 0.1 to 10 Torr.

14. The method of claim 13, wherein a duration of the first purge operation is in the range of approximately 0.001 to 0.10 seconds;
wherein a duration of the second purge operation is in the range of approximately 0.001 to 0.10 seconds.

15. A method for performing temporally pulsed chemical vapor deposition (CVD) on a substrate, comprising:
providing a first reactant to a process chamber in which the substrate is disposed, the first reactant being configured to adsorb on exposed surfaces of the substrate in a self-limiting manner, the first reactant being provided at a partial pressure so that the first reactant diffuses into a gap feature of the substrate, wherein the first reactant is diisopropylaminosilane (DIPAS), bis(diethylamine)silane (BDEAS) or bis(tertiarybuthylamine)silane (BTBAS);
performing a first purge operation, the first purge operation being configured to partially purge gas phase first reactant species, that were not adsorbed, from the process chamber, wherein the first purge operation does not completely remove the gas phase first reactant species from the gap feature, so that a portion of the gas phase first reactant species remains in the gap feature, wherein the gas phase first reactant species remaining in the gap feature following the first purge operation are distributed along a concentration gradient such that the concentration of the gas phase first reactant species increases with increasing depth in the gap feature;
providing a second reactant to the process chamber, the second reactant being configured to react with the first reactant to form a film product, including reaction of the provided second reactant with the adsorbed first reactant species, and reaction of the provided second reactant with the gas phase first reactant species in the gap feature, wherein the second reactant is oxygen;
performing a second purge operation, the second purge operation being configured to partially purge unreacted second reactant species, that did not react with the first reactant, from the process chamber, wherein the second purge operation does not completely remove the unreacted second reactant species from the gap feature, so that a portion of the unreacted second reactant species remains in the gap feature.

16. The method of claim 15,
wherein the first reactant is provided at a partial pressure in the range of approximately 0.1 to 10 Torr;
wherein the second reactant is provided at a partial pressure in the range of approximately 0.1 to 10 Torr;
wherein a duration of the first purge operation is in the range of approximately 0.01 to 0.10 seconds;
wherein a duration of the second purge operation is in the range of approximately 0.01 to 0.10 seconds.

17. The method of claim 15, wherein the method provides for increased deposition rate of the film product with increased depth in the gap feature.

18. The method of claim 15, wherein the reaction of the provided second reactant with adsorbed first reactant species forms the film product on the surfaces on which the first reactant has adsorbed, and wherein the reaction of the provided second reactant with the gas phase first reactant species in the gap feature forms the film product in the gas phase, the film product formed in the gas phase being subsequently deposited on a surface of the gap feature.

19. The method of claim 15, further comprising:
repeating the operations of the method for a predefined number of cycles so as to deposit multiple layers of the film product, wherein a deposition amount of the film product in the gap feature increases with increasing depth in the gap feature.

20. The method of claim 15,
wherein exposing the substrate to the first reactant includes pulsing the first reactant and the additive into a carrier gas stream that is flowed into the process chamber in which the substrate is disposed;
wherein exposing the substrate to the second reactant includes, pulsing the second reactant into the carrier gas stream;
wherein performing the first purge operation includes continuing the flow of the carrier gas stream through the process chamber and evacuating the process chamber;
wherein performing the second purge operation includes continuing the flow of the carrier gas stream through the process chamber and evacuating the process chamber.

* * * * *